(12) United States Patent
Thurmond et al.

(10) Patent No.: US 7,526,393 B2
(45) Date of Patent: Apr. 28, 2009

(54) VIRTUAL BRANCH LOAD MANAGEMENT

(76) Inventors: M. Jason Thurmond, 1306 River Rock Blvd., Murfreesboro, TN (US) 37128; Avery D. Long, 246 Avian La., Madison, AL (US) 35758

( * ) Notice: Subject to any disclaimer, the term of this patent is extended or adjusted under 35 U.S.C. 154(b) by 0 days.

(21) Appl. No.: 11/903,906

(22) Filed: Sep. 25, 2007

(65) Prior Publication Data

US 2009/0082980 A1     Mar. 26, 2009

(51) Int. Cl.
*G01R 21/06* (2006.01)
*G06F 17/00* (2006.01)

(52) U.S. Cl. .............................. 702/60; 702/61; 702/64; 361/86; 361/87; 700/291; 700/292; 700/293

(58) Field of Classification Search ................... 702/60, 702/61, 64
See application file for complete search history.

(56) References Cited

U.S. PATENT DOCUMENTS 4,996,646 A * 2/1991 Farrington ................. 700/293
5,699,051 A * 12/1997 Billig et al. ................. 340/657
6,330,516 B1  12/2001 Kammeter ................... 702/60
6,728,646 B2 * 4/2004 Howell et al. ................. 702/62
6,813,525 B2  11/2004 Reid et al. ..................... 700/19
6,937,003 B2   8/2005 Bowman et al. ........ 324/117 R
7,230,414 B2   6/2007 Bruno ......................... 324/127

\* cited by examiner

*Primary Examiner*—Hal D Wachsman

(57) ABSTRACT

A load estimation algorithm for automatically estimating power consumed by each branch load connected to circuit breakers in a power distribution panel (PDP) without requiring individual current sensing at each branch. The load, estimation algorithm can be operated in a manual mode, remote manual mode, or an agile mode. In manual mode, the user turns off individual circuit breakers in an ordered sequence, and the load estimation algorithm calculates the difference in the power consumption when all loads are connected versus when one load is disconnected to estimate the power consumption of the disconnected load. In the remote manual mode, the circuit breakers are remotely operable, so that load estimation algorithm controls their states through software. In agile mode, the algorithm continuously attempts to estimate power consumption of each load connected to the PDP by comparing present load estimates with previous load estimate and flagging any discrepancies.

15 Claims, 5 Drawing Sheets

VIRTUAL BRANCH LOAD MANAGEMENT

FIELD OF THE INVENTION

The present invention relates generally to power monitoring systems, and, in particular, to virtual brand branch load management in a power monitoring system.

BACKGROUND OF THE INVENTION

Branch circuit monitors are installed within a power distribution panel to measure the power consumed by the branch loads that are connected to the multiple circuit breakers within the distribution panel. For example, in a panel having 24 circuit breakers, 24 current transformers (CTs), one of each branch, are required to measure the branch-level current. For each CT, multiple wires must be connected within the panel to the branch loads and to monitoring circuitry that monitors the current levels in each circuit breaker. Typically, ribbon cables are used to carry these wires, and multiple ribbon cables must be connected properly within the panel, making installation a time-consuming and error-prone process. Moreover, the accuracy of the current readings from the CTs is diminished because the wires connecting the CT to the monitoring circuitry are susceptible to noise.

What is needed, therefore, is a virtual branch load management system that can estimate and record branch level current data without requiring installation of bulky and noise-susceptible metering equipment at the branch level. Aspects of the present invention address these and other needs.

SUMMARY OF THE INVENTION

Briefly, according to an embodiment of the present invention, aspects of this invention eliminate the requirement of current measurement circuitry directly at the branch level circuit breaker to measure and record branch level current data. Measurements from the total load of the Power Distribution Panel (PDP) are taken to estimate individual branch loads. In some aspects, the circuit breakers have remotely operable contacts that can be opened or closed with the aid of a remotely operable motor. Bulky CTs and wiring harnesses are eliminated in the PDP or in the individual breakers, which may have a limited size. Errors and safety hazards due to faulty installation are avoided. The accuracy of the virtual approaches disclosed herein is improved compared to branch circuit monitors employing CTs because there is no signal degradation due to the susceptibility of the wires from the CTs to noise.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
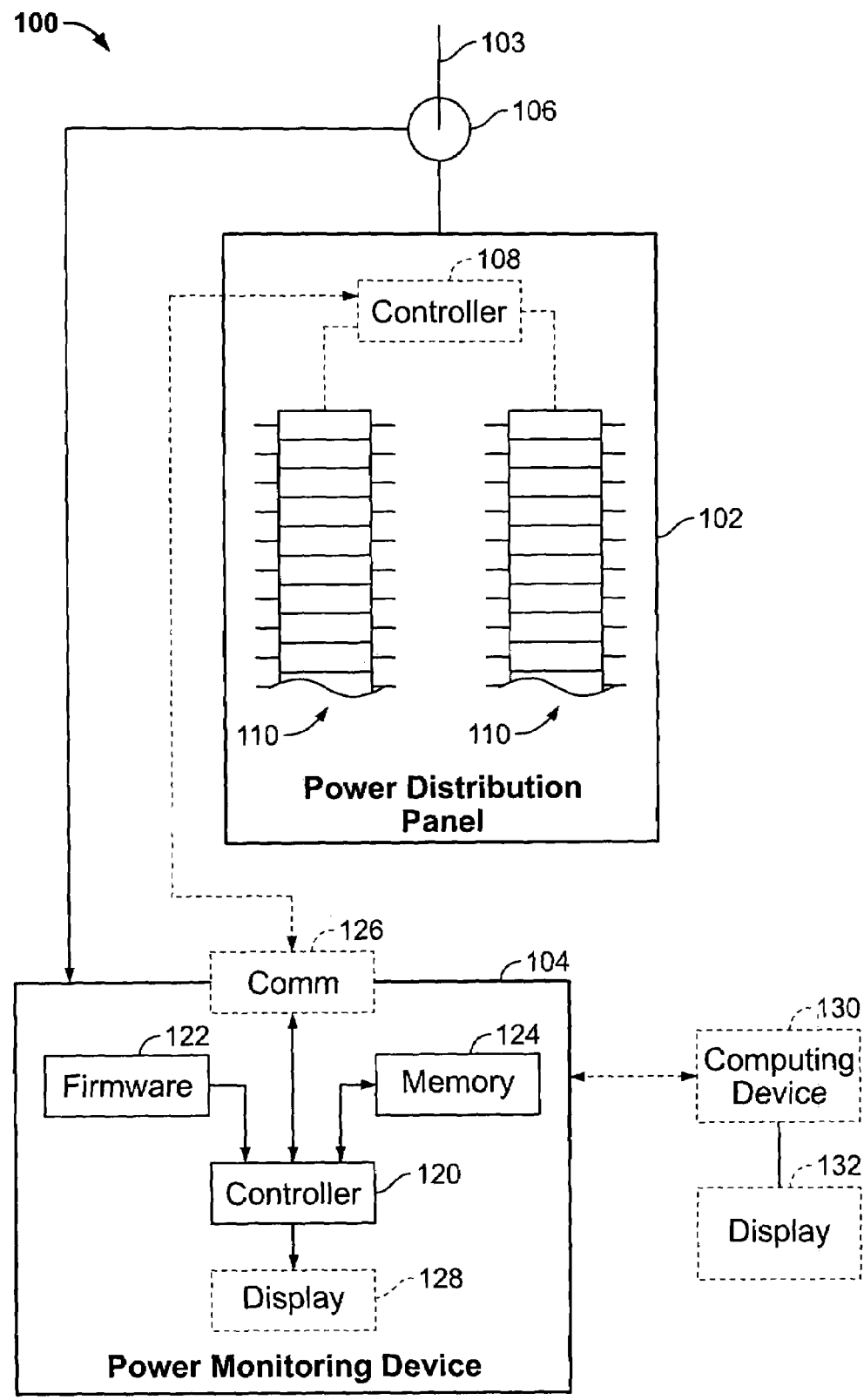
FIG. 1 illustrates a functional block diagram of a main panel metering (MPM) unit having an external current transformer for sensing line current according to an aspect of the present invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Figure 2:
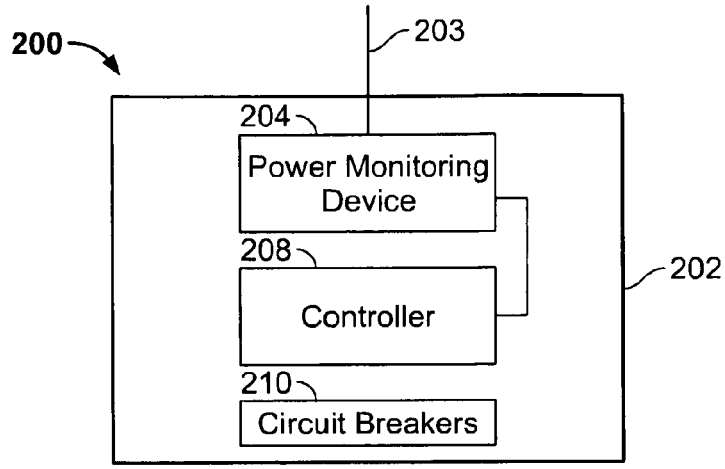
FIG. 2 illustrates a functional block diagram of another MPM unit having an internal current transformer according to another aspect of the present invention.

Aspects of the present invention eliminate branch-level metering circuitry (mainly current measurements) by employing metering in the main circuit breaker external to the PDP 102 (FIG. 1) or within the PDP 202 (FIG. 2). Either scenario is referred to herein as the Main Panel Metering (MPM), and the PDP 102, 202 together with a power monitoring device 104, 204 are designated generally as an MPM unit 100 in FIG. 1 and MPM 200 in FIG. 2. In FIG. 1, the main CT 106 is external to the PDP 102, whereas in FIG. 2, the main CT is internal to the PDP 202. MPM has several control modes to estimate and record the loads of the individual breakers 110, 210. Preferably, the control modes assume that each branch load of the PDP 102, 202 is at average load usage.

The main CT 106 inductively couples the line current on line conductor 103 to produce a proportional current that is provided to the PDP 102 and to a power monitoring device 104 optionally in communication with a controller 108 of the PDP 102 via a communications interface 126. The monitoring device 102 may be based on a POWERLOGIC® Series 3000/4000 Circuit Monitor or a POWERLOGIC® ION7550/7650 Power and Energy Meter available from Schneider Electric or any other suitable monitoring device such as a circuit breaker, a relay, a metering device, or a power meter. The circuit breakers in the PDP 102 may have manually reclosable contacts or they may be remotely operable to open or close under control of a motor. The power monitoring device 104 includes a controller 120 that executes machine instructions stored in firmware 122 and is coupled to a memory 124 for storing data accessed by the firmware 122. An optional display 128 can display status or other information. The power monitoring device 104 may be coupled to a host computer 130 coupled to a display 132.

The MPM 200 shown in FIG. 2 has a main CT internal to the PDP 202, and the line conductor 203 is brought to a power monitoring device 204 within the PDP 202. The power monitoring device 204 is coupled to a controller 208. The MPM unit 200 includes a plurality of breakers 210 just like the MPM unit 100. A computing device may also be connected to the MPM unit 200 as shown in FIG. 1.

The first control mode is termed Manual Mode, which does not require remotely controlling the circuit breakers within the MPM unit 100, 200. As a result, Manual Mode can work in a variety of installation scenarios. The user via software 122 to the MPM unit 100, 200 can configure how many circuit breakers 110 are installed in the PDP 102, 202 and which breakers 110, 210 the user desires to estimate branch load. The user initiates the sequence, then manually turns off the breaker 110 for a period of time, for example, 10 seconds, to allow the MPM unit 100, 200 to measure the load delta and record it for the appropriate circuit breaker 110, 210 in an ordered breaker sequence. The user cycles the circuit breakers 110, 210 in order until all loads have been estimated, The MPM unit 100, 200 knows when each circuit breaker 110 is turned off by sensing the reduction in load of the overall panel. Once the load to the circuit breaker 110, 210 is restored, the MPM unit 100, 200 knows it is ready to estimate the load of the next circuit breaker 110, 210 in the sequence. Load estimation techniques are explained below because they apply to all control modes.

The next control mode is termed Remote Manual Mode, which is similar to the Manual Mode but has the ability to remotely control the opening and closing of the contacts of the circuit breakers 110, 210. The MPM unit 100, 200 includes a communications link to a remote controlled breaker system (RCBS) to automatically cycle each circuit breaker. The user initiates a fully automated estimation sequence via, for example, the computing device 130. The MPM unit 100, 200 reads the circuit breaker configuration from the RCBS without requiring the user to input the circuit breaker configuration within the PDP 102, 202. The MPM unit 100, 200 sends commands to the RCBS to cycle each individual circuit breaker 110, 210. The MPM unit 100, 200 measures the total load to detect the reduction in the load, records and proceeds to cycle the next circuit breaker 110, 210 until all loads have been estimated. An example of a suitable remote controlled breaker system includes the POWERLINK® system available from Square D Company.

The third control mode is termed the Agile Mode, which is the most flexible and automated of these control modes. The Agile Mode is also very similar to the Remote Manual Mode except that the Agile Mode can learn on-the-fly while the RCBS is in operation. The MPM unit 100, 200 first measures the total measured load (how much power is consumed by all the loads) assuming average loading of the PDP 102, 202 and an average loading for each branch circuit as well. The MPM unit 100, 200 periodically polls (such as every 30 seconds) via a communications link the RCBS to report the state of all configured circuit breakers. If a remotely operable circuit breaker 110, 210 is found to be in an OFF state then the MPM unit 100, 200 subtracts the load for that branch circuit breaker 110, 210 and waits for the others to turn off during normal operation of the PDP 102, 202. As the RCBS switches circuit breakers off for normal programmed operation of the panel, the MPM unit 100, 200 attempts to estimate the loading (how much power is being consumed by the loads) of each circuit breaker 110, 210. If more than one circuit breaker 110, 210 is in the OFF state, the MPM unit 100, 200 can remove the two branch loads from the total as a known quantity and record for reporting and continued estimations. The MPM unit 100, 200 will continue to watch and remove circuit breakers 110, 210 of sets of circuit breakers reporting the loads to the best granularity possible. It will also provide a status of the complete progress indicating loads that are estimated and those that are not (see FIG. 5B, discussed below). It will complete after all individual breakers have been estimated. An advantage of the Agile Mode is that it can report a complete status indicating knowledge of all individual breaker loads but then continue to refine the loads as the RCBS continues to operate. The MPM unit 100, 200 will continue to monitor circuit breakers 110, 210 as they cycle to ensure the same estimation as before. If the estimation differs, the load reporting will indicate a questionable status and recognize that the total load of the PDP 102, 202 has changed. The MPM unit 100, 200 then attempts to locate which circuit breaker's or breakers' load(s) has increased or decreased.

Load Estimation Algorithms

According to various aspects herein, a load estimation algorithm is generally carried out on a breaker-by-breaker basis by measuring the delta between the previous total and present total. The load estimation algorithm calculates the difference (delta) and allocates it to the circuit breaker that has been turned off (either manually or automatically under remote control). The delta value is stored in a table in non-volatile memory, such as the memory 124 or in the computing device 130, (see FIG. 5B, discussed below) for reporting on the local display 128 or back to software running on the computing device 130. The reporting indicates to the user the estimated individual loads of circuit breakers 110, 210 as they are confirmed. The power monitoring device 104, 204 runs calculations to determine power and energy for those individual circuit breakers. This information supplies knowledge of branch power usage and allows circuit loads to be managed without the expense of cumbersome branch-level metering.

Figure 3:
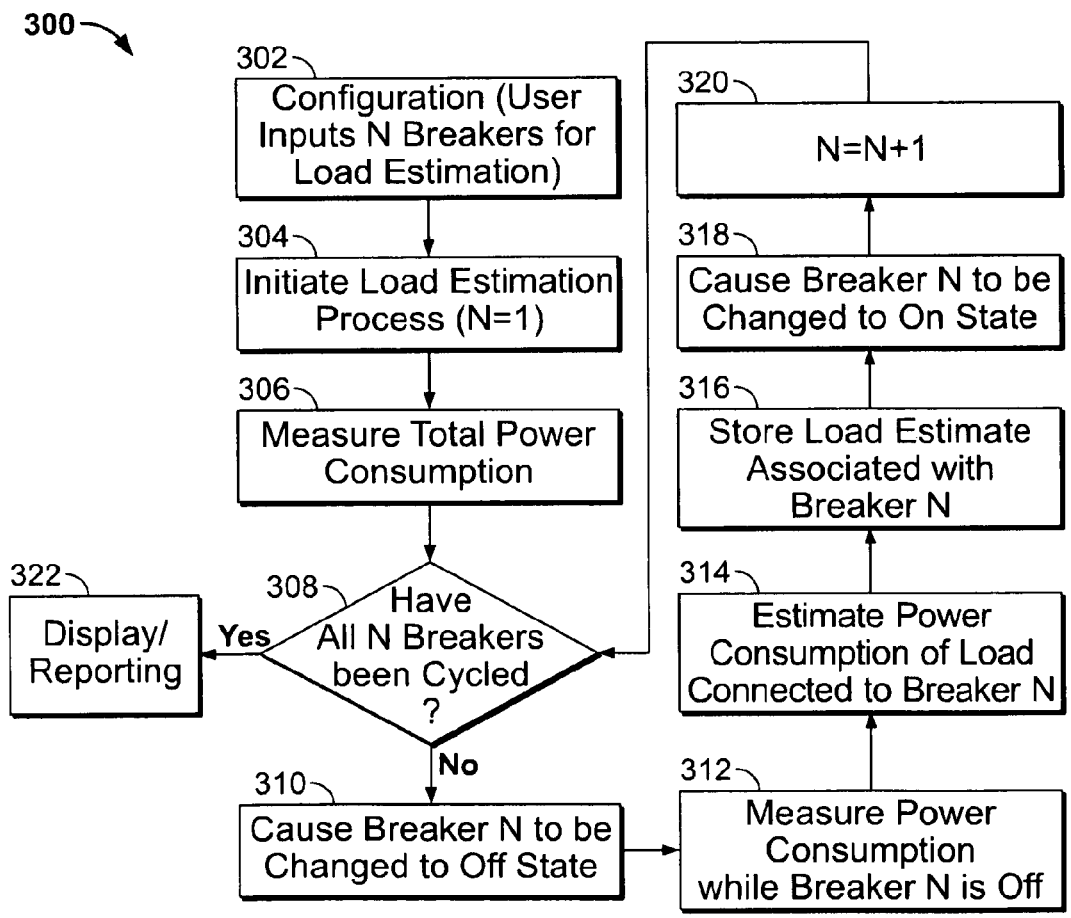
FIG. 3 is a flow chart diagram of a load estimation algorithm according to an implementation of the present invention.

Turning to the specific load estimation algorithms according to various aspects of the present invention, FIG. 3 is a flow chart diagram of an example load estimation algorithm 300 that corresponds to the Manual Mode or Remote Manual Mode. At configuration, the user indicates which circuit breakers 110, 210 whose loads need to be estimated (302) and optionally which load estimation Mode to use (e.g., Manual or Remote Manual), and the algorithm 300 initiates a load estimation process (304). The algorithm 300 can auto-recognize the presence of an RCBS and automatically configure itself to run in the Remote Manual Mode. Via the external CT 106 of the MPM unit 100 or the internal CT of the MPM unit 200, the algorithm 300 measures the total power consumption of all loads connected to the circuit breakers 110, 210 and stores this value in a table (306). The algorithm 300 checks whether all breakers to be cycled have been cycled (308), and if not, causes the circuit breaker under consideration to be changed from an ON state (i.e., the contacts of the circuit breaker are in a closed position, allowing current to flow to the load) to the OFF state (i.e., the contacts of the circuit breaker are in an open position, disconnecting the load and interrupting the flow of current to the load) (310). In the Manual Mode, the algorithm 300 prompts the user via the display 128, 132 to cycle the circuit breaker OFF (310), and the user causes that circuit breaker to be turned OFF. In the Remote Manual Mode, the algorithm 300 directly causes the circuit breaker to be cycled OFF by instructing the RCBS to cycle OFF the circuit breaker under consideration (310).

After the circuit breaker under consideration has been turned OFF, the algorithm 300 measures the total power consumption of all the loads connected to the remaining circuit breakers that remain in an ON state (312). An estimate of the power consumption of the load connected to the circuit breaker under consideration is computed by calculating the difference between the present power consumption value and the total power consumption value previously stored in the table (314). This difference is stored as a load estimate value associated with the circuit breaker under consideration in another table (such as table 522 shown in FIG. 5B) (316). The algorithm 300 causes the circuit breaker under consideration to be changed from its OFF state back to its ON state (318) either by prompting the user to cycle the circuit breaker back ON or by instructing the RCBS to do so. The next circuit breaker is cycled and this process is repeated until all of the circuit breakers have been cycled (308). The algorithm 300 displays a report to the user on the display 128, 132 of the load estimations of each branch circuit and the total power consumption of all loads. Any suspect circuit breakers are also identified and reported to the user.

Figure 4:
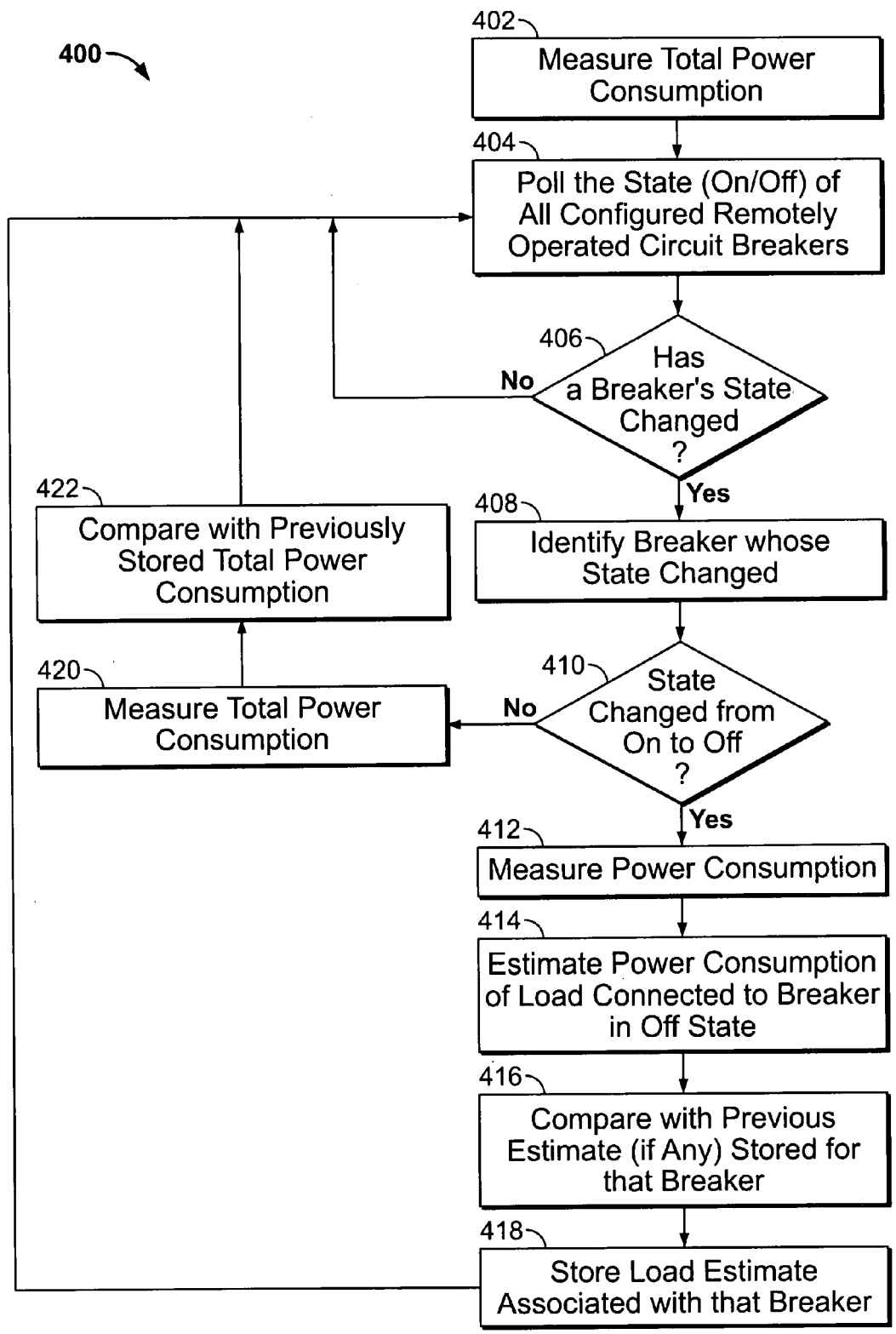
FIG. 4 is a flow chart diagram of a load estimation algorithm according to another implementation of the present invention.

Another load estimation algorithm 400 is flow-charted in FIG. 4. This algorithm 400 operates in the Remote Manual or Agile modes because it requires the circuit breakers to have remotely operable contacts. The algorithm 400 measures the total power consumption of all loads connected to the remotely operated circuit breakers 110, 210 (402) and polls the state (ON or OFF) of all configured remotely operated circuit breakers 110, 210 (404). The algorithm 400 checks whether any breaker's state has changed (406) and identifies which breaker's state changed (408). If the breaker under consideration changed from ON to OFF (410), the algorithm 400 measures the power consumption (412) and estimates the power consumption of the load connected to the breaker in the OFF state (414) by calculating the difference between the previously stored total power consumption (402) and the present total power consumption (412). The algorithm compares the previous estimate, if any, stored for that breaker (416) and computes a load estimate associated with that breaker by calculating the difference between the total power consumption prior to the state change and the total power consumption after the state change. The algorithm 400 stores the load estimate associated with that breaker (418) and resumes polling all configured remotely operated circuit breakers (404).

If the state of the circuit breaker under consideration has changed from OFF to ON (410), the algorithm 400 measures the total power consumption (420) and compares that value with the previously stored total power consumption (422). In the event of any discrepancy, the algorithm 400 flags the user on the display 128, 132 that the estimate for that breaker is suspect and needs to be relearned. Alternately or additionally, the algorithm 400 can update the load estimate for that breaker by adding or subtracting the delta from the power consumption value previously stored for that breaker. In the Agile Mode, the algorithm 400 will eventually update its load estimate is for that breaker when it returns to the OFF state. Over time in the Agile Mode, the algorithm 400 will become highly accurate at estimating the power consumed by all of the branch loads without requiring expensive and bulky CTs at each branch level and without loss of degradation of signal integrity that plague existing load estimation techniques.

Figure 5A:
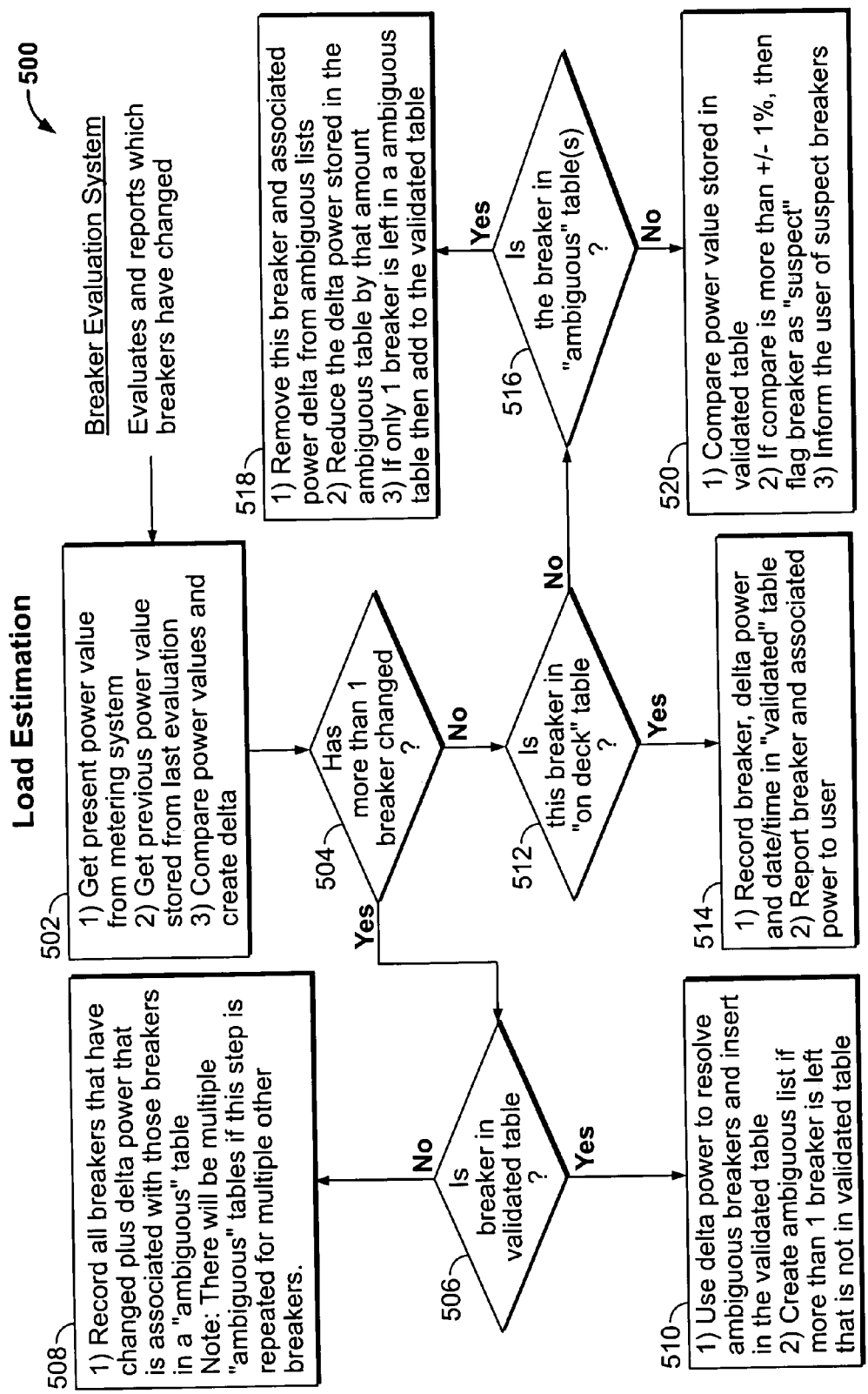
FIG. 5A is a flow chart diagram of a load estimation algorithm according to yet another implementation of the present invention.
Figure 5B:
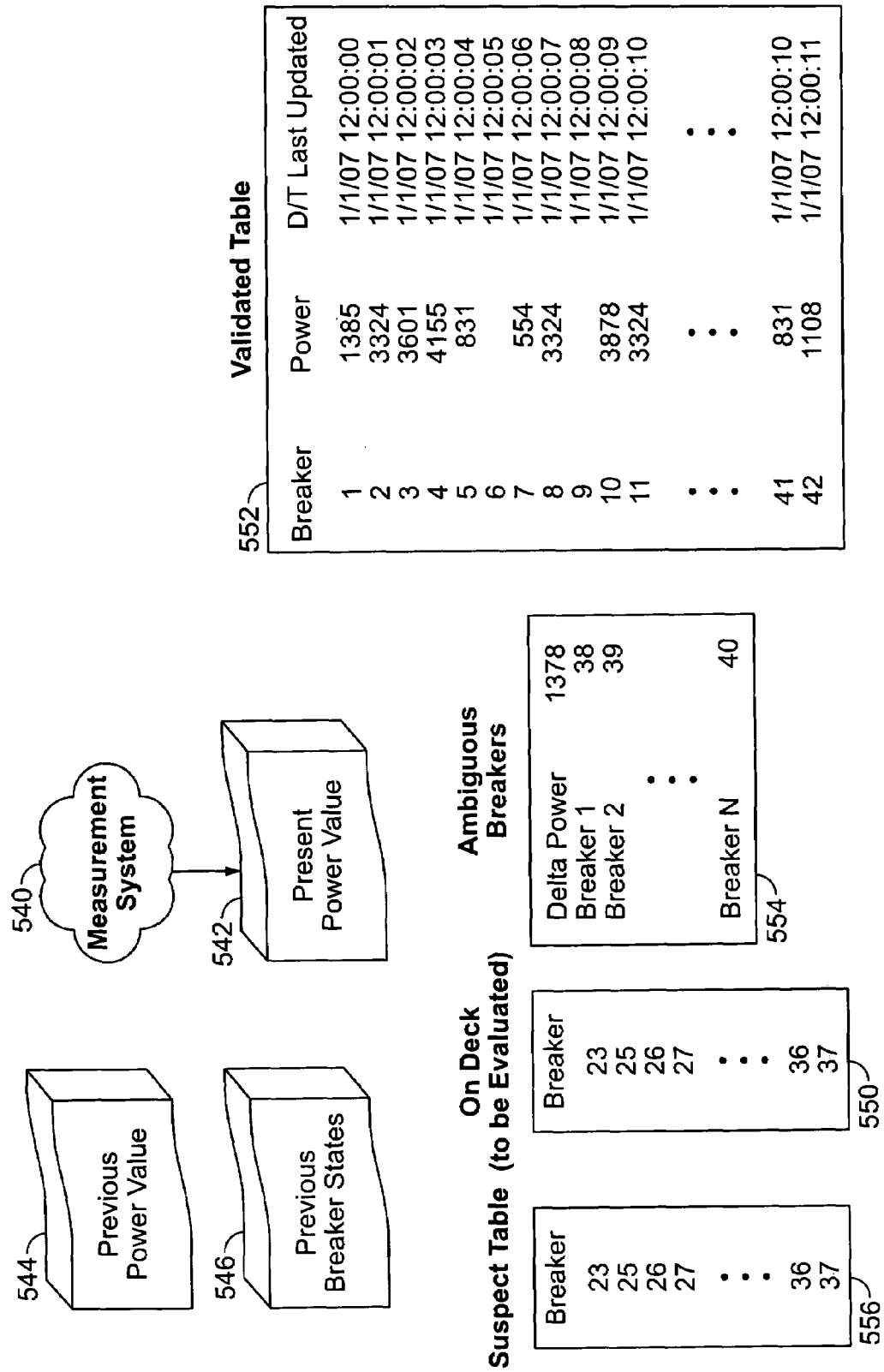
FIG. 5B is a functional block diagram of various tables or databases utilizes by the load estimation algorithms of FIG. 3, 4, or 5A.

Turning now to FIGS. 5A and 5B, an exemplary flow chart diagram of a load estimation algorithm 500 is shown in FIG. 5B along with various tables used by the load estimation algorithm 500 in FIG. 5B. A measurement system 540 that includes the MPM unit 100, 200 produces present power values 542 and stores them in a memory, such as the memory 124. The present power values represent the power derived from the current sensed by the internal or external CT 106, which is coupled to the line conductor 103. One or more previous power values 544 are also tracked and stored in the memory 124 along with date and time stamps. Previous breaker states 546 are also recorded along with a breaker identification number or address and date and time stamps to keep track of which breakers are in which states and when.

Several tables are also maintained while the load estimation algorithm (such as any load estimation algorithm 300, 400, 500 disclosed herein) is running in Manual, Remote Manual, or Agile Mode. An "On Deck" table 550 of circuit breakers to be evaluated keeps track of identification numbers or addresses of those breakers that have yet to be evaluated by the load estimation algorithm. For these breakers, the estimated power consumption of their connected loads is not yet known. An ambiguous breaker table 554 keeps track of multiple circuit breakers whose load estimates cannot be clearly ascertained because, for example, multiple circuit breakers changed their state. As each one is cycled on an individual basis, the load estimation algorithm can transition these breakers from the ambiguous breaker table 554 to another table. The ambiguous breaker table 554 also includes a running tally of the total delta power associated with all of the ambiguous breakers listed in the table 554. This running total is decremented as circuit breakers are removed from the table 554 or incremented as circuit breakers are added to the table 554. Note that there may be multiple ambiguous breaker tables, one for each set of multiple circuit breakers whose states change to OFF at different times.

A suspect breaker table 556 stores information indicative of those breakers whose load estimations are suspect, usually a discrepancy is discovered between a current estimate and a previously stored estimate. Breakers in this table 556 will need to be reevaluated and their load re-estimated. Finally, a validated table 552 includes a list of circuit breakers whose loads have been estimated and validated and are not suspect or ambiguous. The validated table 552 includes identification or address information associated with the validated circuit breakers, their associated power value of the load connected to the circuit breaker, and the date and time that that entry in the table 552 was last updated.

The load estimation algorithm 500 evaluates and reports which circuit breakers have changed their states between ON and OFF and automatically estimates the power consumed by their loads. In particular, the load estimation algorithm 500 can handle scenarios in which multiple circuit breakers cycle to an OFF state. The algorithm 500 obtains the present power value from the power monitoring system 104, 204. The power value is derived from the current sensed by the CT 106 and a voltage derived from the sensed current. The algorithm 500 retrieves the power value stored from the previous evaluation and compares the previous and present power values to produce a delta power value (502).

The algorithm 500 determines whether more than one circuit breaker has changed its state (504). If not, the algorithm 500 determines whether the one circuit breaker is in the On Deck table 550. If so, the algorithm 500 records the identification or address information of that circuit breaker, the delta power value, and the date and time in the validated table 552 (514). If not, the algorithm 500 determines whether the one circuit breaker is in the ambiguous breaker table 554 (516). If not, the algorithm 500 compares the delta power value with the delta power value stored in the validated table 552 for the one circuit breaker. If that comparison deviates by more than a predetermined threshold, for example +/−1%, the algorithm 500 flags the one circuit breaker as "suspect" and stores its identification or address information in the suspect table 556 and reports the suspect circuit breaker to the user (520). If the one circuit breaker is in the ambiguous breaker table 554 (516), the algorithm 500 removes the one circuit breaker and its associated delta power value from the ambiguous breaker table 554, reduces the delta power total stored in the ambiguous breaker table 554 by that amount, and, if only one circuit breaker remains in the ambiguous breaker table 554, the algorithm 500 adds the one circuit breaker to the validated table 552 (518).

Returning to block (504), if more than one circuit breaker's state has changed (504), the algorithm 500 determines whether each circuit breaker whose state has changed is in the validated table 552 (506). If so, the algorithm 500 attempts to resolve ambiguous breakers and insert their associated delta power values into the is validated table 552. If more than one circuit breaker remains that are not in the validated table 552, the algorithm 500 adds those circuit breakers to the ambiguous breaker table and increments the total delta power value accordingly (510). If the circuit breakers under consideration are not in the validated table (506), the algorithm records in the ambiguous breaker table 554 all circuit breakers whose states have changed along with their associated delta power (508). The algorithm 500 iterates to try to resolve these ambiguities by waiting until only one circuit breaker has cycled to an OFF state and then subtracting the delta power associated with that circuit breaker from the ambiguous breaker table 554 and moving that circuit breaker to the validated table 552. These iterations are repeated until no circuit breakers remain in the ambiguous breaker table 554. Additionally, the user may attempt to force a resolution of any ambiguities by instructing the RCBS to cycle a specific circuit breaker to an OFF state to permit the algorithm to calculate its power load.

Any of the algorithms described herein include machine readable instructions for execution by: (a) a processor, (b) a controller, such as the controller 120, and/or (c) any other suitable processing device. It will be readily understood that the computing device 130 includes such a suitable processing device. Any algorithm disclosed herein may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Also, some or all of the machine readable instructions represented in any flowchart depicted herein may be implemented manually. Further, although specific algorithms are described with reference to flowcharts depicted herein, persons of ordinary skill in the art will readily appreciate that many other methods of implementing the example machine readable instructions may alternatively be used. For example, the order of execution of the blocks may be changed, and/or some of the blocks described may be changed, eliminated, or combined.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A load estimation method, comprising:
   measuring a line current via a power monitoring device coupled to a plurality of circuit breakers each connectable to a respective load;
   calculating, based on said line current and a voltage corresponding to said line current, a total power consumption measured by said power monitoring device to produce a first total power value;
   receiving an indication that a state of a first of said plurality of circuit breakers has changed from on to off thereby disconnecting said load associated with said first circuit breaker;
   responsive to said receiving said indication, automatically calculating a total power consumption measured by said power monitoring device to produce a second total power value;
   computing a power consumption of said load associated with said first circuit breaker by subtracting said second total power value from said first total power value to produce a delta power value; and
   storing said delta power value in a memory.

2. The method of claim 1, further comprising instructing a remote controlled breaker system to cause said first circuit breaker to open contacts for disconnecting said load associated with said first circuit breaker.

3. The method of claim 1, wherein said indication is an input entered by a user confirming that said state of said first circuit breaker has changed to off.

4. The method of claim 1, further comprising:
   comparing said delta power value with a previous delta power value stored for said first circuit breaker;
   flagging said first circuit breaker as a suspect circuit breaker when said delta power value differs from said previous delta value by more than a predetermined threshold; and
   displaying an indication of said suspect circuit breaker.

5. The method of claim 1, wherein said storing includes storing identification information associated with said first circuit breaker in said memory and the date and time said delta power value is stored in said memory.

6. The method of claim 1, further comprising sensing said line current in a current transformer, wherein said plurality of circuit breakers are housed within a power distribution panel, said current transformer being external to said power distribution panel.

7. A method of estimating power consumed by a plurality of loads coupled to a plurality of remotely operated circuit breakers, comprising:
   coupling a power monitoring device to said plurality of remotely operated circuit breakers each coupled to respective ones of a plurality of loads, said power monitoring device measuring electrical power consumed by said those of said loads that are connected to respective ones of said circuit breakers by sensing a line current;
   calculating a total power consumption measured by said power monitoring device to produce a first total power value;
   automatically polling each of said remotely operated circuit breakers to determine whether any of said remotely operated circuit breakers is in an on or off state;
   determining whether said state of any of said remotely operated circuit breakers has changed;
   responsive to said state of a first of said remotely operated circuit breakers changing from on to off, computing the amount of power consumed by said load associated with said first remotely operated circuit breaker by calculating a total power consumption measured by said power monitoring device to produce a second total power value and subtracting said second total power value from said first total power value to produce a delta power value; and
   storing said delta power value in a memory.

8. The method of claim 7, further comprising:
   comparing said delta power value with a previous delta power value associated with said first remotely operated circuit breaker;

flagging said first remotely operated circuit breaker as suspect when said delta power value differs from said previous delta power value by more than a predetermined amount; and storing an indication of said first remotely operated circuit breaker in said memory.

9. The method of claim 8, further comprising:

responsive to said state of a second remotely operated circuit breaker changing from off to on, calculating a total power consumption measured by said power monitoring device to produce a third total power value;

comparing said third total power value with said first total value;

flagging said second remotely operated circuit breaker as suspect when said third total power value differs from said first total value by more than a predetermined threshold; and storing an indication of said second remotely operated circuit breaker in said memory.

10. The method of claim 8, further comprising displaying information indicative of said delta power value and said first remotely operated circuit breaker.

11. The method of claim 7, wherein said power monitoring device includes a current transformer for sensing said line current.

12. A method of automatically calculating power associated with respective remotely operated circuit breakers housed in a power distribution panel, comprising:

receiving a signal indicative of a total power value from a power monitoring device that calculates said total power value based on a line current sensed on a line conductor to which a plurality of remotely operated circuit breakers are electrically coupled;

comparing said total power value with a previous total power value that was stored previously;

calculating a delta power value from the difference between said total power value relative to said previous total power value;

automatically determining whether more than one of said plurality of remotely operated circuit breakers has changed states;

responsive to more than one of said remotely operated circuit breakers having changed states, determining which of said remotely operated circuit breakers have changed states to produce a set of changed circuit breakers, adding said delta power value to an accumulated delta power value, and storing information indicative of an identification of each remotely operated circuit breaker in said set of changed circuit breakers and said accumulated delta power value in a first table in a memory.

13. The method of claim 12, further comprising:

responsive to only one of said remotely operating circuit breakers having changed states, associating said one remotely operating circuit breaker with said delta power value and storing said delta power value and an indication of said associated one remotely operating circuit breaker in said memory.

14. The method of claim 13, further comprising:

responsive to said only one of said remotely operating circuit breakers having changed states, comparing said delta power value with a previous power value stored in said memory for said one remotely operating circuit breaker, flagging said one circuit breaker as suspect when said delta power value exceeds said previous power value by more than a predetermined threshold, and displaying an indication that said one remotely operating circuit breaker is suspect.

15. The method of claim 12, further comprising:

responsive to only one of said remotely operating circuit breakers having changed states, determining whether an identification of said one remotely operating circuit breaker is in said first table, and, if so, removing said identification of said one remotely operating circuit breaker from said first table and subtracting said delta power value associated with said one remotely operating circuit breaker from said accumulated delta power value stored in said first table.

* * * * *